United States Patent [19]

Barkats et al.

[11] 4,392,007

[45] Jul. 5, 1983

[54] SOLAR GENERATOR PROVIDING ELECTRICITY AND HEAT

[75] Inventors: Gérard Barkats, Mandelieu; Alain Girard, Cros de Cagnes; Jean Marchal, Peymeinade; Charles Morel, Le Cannet, all of France

[73] Assignee: Societe Nationale Industrielle Aerospatiale, Paris, France

[21] Appl. No.: 304,853

[22] Filed: Sep. 23, 1981

[30] Foreign Application Priority Data

Oct. 9, 1980 [FR] France ............................. 80 21595

[51] Int. Cl.³ .................... H01L 31/04; F24J 3/02
[52] U.S. Cl. ............................... 136/248; 136/246; 136/259; 126/417; 126/434; 165/104.21; 357/82
[58] Field of Search .................. 136/246, 248, 259; 165/104.21; 357/82; 126/417, 434

[56] References Cited

U.S. PATENT DOCUMENTS 3,598,178  8/1971  Staub ........................... 165/104.26
4,149,903  4/1979  Lindmayer ..................... 136/248
4,211,581  7/1980  Vasilinina et al. ............. 136/259

*Primary Examiner*—Aaron Weisstuch
*Attorney, Agent, or Firm*—Merriam, Marshall & Bicknell

[57] ABSTRACT

The invention relates to a support for at least one photovoltaic cell, comprising at least one block made of heat-conducting material with which said cell is in close thermal contact. According to the invention, this support comprises at least one tube the wall of which may be traversed by the heat, said tube being fastened to said block, in thermal contact therewith, and closed at its end to define a closed cavity inside which an evaporable and condensable fluid is enclosed. The invention is particularly applicable to a solar generator.

7 Claims, 3 Drawing Figures

U.S. Patent     Jul. 5, 1983     4,392,007
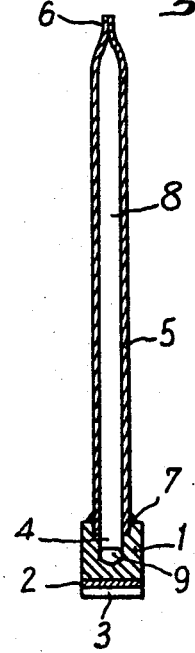
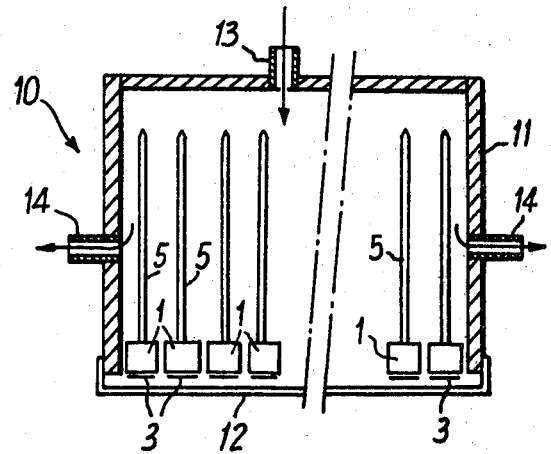
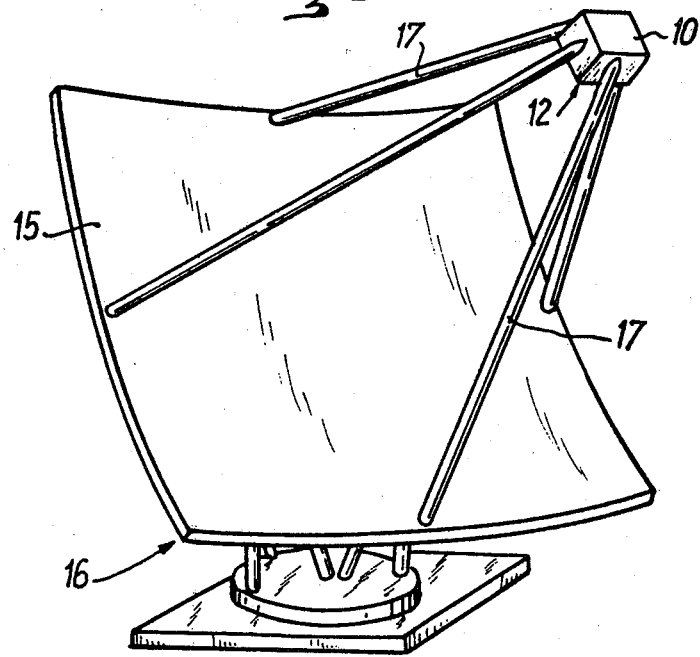

SOLAR GENERATOR PROVIDING ELECTRICITY AND HEAT

The present invention relates to a support for a photovoltaic cell, to a battery of photovoltaic cells provided with such supports and to a solar generator provided with such a battery.

Solar generators are already known which comprise an assembly of photovoltaic cells which convert solar energy into electrical energy. In certain of these known generators, a device is provided for condensing the sun's radiation, such as a concave mirror, moved by a mechanism for orientation which is servo-controlled so as to be constantly directed towards the sun, said assembly of photovoltaic cells being disposed at the focus of said condensation device and held in place by means of arms fixed to the periphery thereof.

Furthermore, it is known that, in order to function correctly, the temperature of the photovoltaic cells must be regulated. To this end, devices such as fins are provided which make it possible to dissipate the heat released in said photovoltaic cells. However, not only are these devices not totally effective for regulating the temperature of said photovoltaic cells, but they also are heavy and cumbersome. This results in the mass of the mobile part of the generator being high and the orientation of the condensation device being difficult to control due to the high inertia, thus requiring a powerful mechanism for orientation. Moreover, due to their large dimensions, known heat dissipating devices cast a large shadow on the mirror, which is detrimental to the yield of the generator.

It is an object of the present invention to remedy these drawbacks and to provide a light, small-dimensioned focal assembly of photovoltaic cells, whilst enabling the cells to be electrically insulated and allowing good heat conduction to be maintained.

To this end, according to the invention, the support for at least one photovoltaic cell comprising at least one block of heat-conducting material with which said cell is in close thermal contact, is noteworthy in that it comprises at least one tube whose wall may be traversed by the heat, said tube being fastened to said block, in thermal contact therewith and closed at its ends to define a closed cavity inside which an evaporable and condensable fluid is enclosed.

Said block preferably comprises a recess outwardly extended by said tube, said closed cavity then being formed by said recess and the tube.

Thus, when heat is released in the photovoltaic cell, during functioning thereof, this liberation of heat causes the liquid phase of the fluid to evaporate and the resulting vapor phase moves towards the end of the tube opposite the block. All along the tube, the vapor phase passes its heat to said tube and recondenses.

The condensed liquid phase may be returned towards the block by an inner coating of the tube forming a capillary network. However, according to an advantageous embodiment in which the block is directed downwardly and the tube upwardly, the condensed liquid phase returns under the sole action of gravity, this avoiding having to provide any auxiliary return device.

The support according to the invention may be in one piece, for example obtained by moulding. It may also be constituted by assembling the block and the tube together by soldering.

In order to promote evacuation of the heat transmitted to said tube, it is advantageous to enclose at least said tube in a water-tight chamber, in which a fluid, for example a liquid, circulates.

Thus, a battery of photovoltaic cells, particularly for a solar generator, may comprise a water-tight chamber which is provided with a cold fluid inlet and a hot fluid outlet and which encloses at least the tubes of a plurality of supports according to the invention, provided with their photovoltaic cells.

A light, small-dimensioned assembly is thus obtained, in which the temperature of the photovoltaic cells is easily regulated and which is particularly well suited for a generator with a mobile solar condensation device and focal assembly. Moreover, in addition to the electrical energy produced, the assembly of photovoltaic cells according to the invention yields heat to a fluid, preferably water, this increasing its output.

The invention will be more readily understood on reading the following description with reference to the accompanying drawings, in which:

FIG. 1 is a view in longitudinal section of a support for photovoltaic cell according to the present invention.

FIG. 2 schematically illustrates an assembly of photovoltaic cells according to the invention.

FIG. 3 schematically shows, in perspective, a solar generator comprising the assembly of photovoltaic cells of FIG. 2.

Referring now to the drawings, the support according to the invention and shown in FIG. 1 comprises a block 1 of good heat-conducting material, such as copper, for example cubic in shape. A photovoltaic cell 3 is fixed on one face of said block 1, for example by a soft-solder 2, so that said cell is in close thermal contact with the block 1.

Furthermore, a recess 4, directed towards the photovoltaic cell 3 is made in said block 1 through its face opposite said photovoltaic cell. The recess 4 is extended, opposite the block 1, by a tube 5, also made of a good heat conducting material, such as copper. At its end opposite the block 1, the tube 5 is hermetically closed by a seal 6.

In FIG. 1, it has been assumed that the tube 5 was added to the block 1 by fitting in the recess 4, then soldering at 7. It goes without saying that the tube 5 and the block 1 may be in one piece, for example obtained by moulding, the seal 6 being made subsequently.

A small quantity of a volatile substance 9, such as an alcohol, is disposed in the closed cavity 8 thus defined by the tube 5 and the recess 4. The volume of this substance 9 may for example correspond to one twentieth of the volume of the cavity 8.

The assembly 1 to 9 is disposed so that the photovoltaic cell 3 is directed downwardly, with the result that the tube 5 is directed upwardly.

Thus, when the cell 3 receives appropriate radiation, on the one hand it produces electrical energy which is collected in a manner not shown in the drawings, and, on the other hand, it is the site of a liberation of heat. It is known that this heat must be removed so as to control the temperature of the photovoltaic cell 3 and to maintain it in a range ensuring optimal functioning of said cell. The process of removal of heat from the support according to the invention is as follows.

The cell 3 transmits its heat to the block 1 through the solder 2 and from there to tube 5 by conduction. Moreover, the heat received by the block 1 vaporises the liquid 9 and the vapor thus formed moves in the cavity 8 in the direction of the seal 6. When the vapor encounters a point of the tube 5 which is sufficiently cold, it condenses and the condensate returns into the recess 4, flowing by gravity along the walls of the tube 5. The tube 5 therefore receives the heat from the cell 3 both by conduction and by transmission by the heat-carrying fluid.

The heat received by the tube 5 is then taken therefrom by the fluid medium (gas or liquid) surrounding the tube 8.

It will be noted that the tube 5 is not necessarily made of a good heat-conducting material. In fact, it may be made of glass or synthetic material, with a sufficiently thin wall to be traversed by the flow of heat with small temperature difference. In this case, the exchange of heat takes place solely via the fluid 9.

FIG. 2 shows a battery 10 of photovoltaic cells 3, mounted on their supports 1, 5. The assemblies 1, 3, 5 are enclosed in a water-tight chamber 11, provided with a transparent wall 12, through which the photovoltaic cells 3 receive the radiation whose energy is to be converted into electricity. Moreover, the water-tight chamber 11 is provided with an inlet 13 for cold fluid such as water and with outlets 14 for said fluid heated by absorbing the heat transmitted, in the manner described hereinabove, from the cells 3 to their respective tubes 5. Thus, it is possible to recover the heat liberated in said photovoltaic cells 3.

Of course, the assemblies 1, 3, 5 are coated, if necessary, with an electrically insulating film (not shown) enabling them to be bathed by the cooling fluid without parasitic electrical connections being established between them.

Moreover, instead of being enclosed in the chamber 11, the cells 3 may be outside said chamber, fluid tightness being ensured either at block 1 or tube 5. In this case, there is no need for the transparent wall 12.

FIG. 3 schematically illustrates a solar generator comprising a concave mirror 15, mounted on a mechanism 16 for orientation. On the periphery of the mirror 15 are provided convergent arms 17 supporting the battery 10 of FIG. 2, so that the cells 3 are in the focal plane of said mirror. The mirror 15 is orientated towards the sun, and the cells 3 are directed downwardly and the assemblies 1, 3, 5 function in the manner described hereinabove. The inlet and outlet pipes for fluid (not shown) connected to the inlets and outlets 13 and 14 of the battery 10 preferably pass through certain of the arms 17.

It is thus seen that, due to the invention, a light, small-dimensioned photovoltaic battery is obtained which has no adverse effect on the orientation mechanism 16, whilst allowing recovery of the thermal energy produced by the photovoltaic cells 3.

What is claimed is:

1. A solar energy collecting device comprising:
   a plurality of photovoltaic cells;
   a plurality of heat pipes;
   said photovoltaic cells being carried by said heat pipes in heat transfer relationship therewith; and
   a fluid-tight cooling chamber provided with a cold fluid inlet and hot fluid outlet and enclosing at least said plurality of heat pipes.

2. The device of claim 1, wherein each heat pipe comprises at least one solid block of heat-conducting material on which at least a part of a said photovoltaic cell is fixed so as to be in close thermal contact with said block, and at least one tube whose wall may be traversed by heat generated in said cell, said tube being fastened to said block, in thermal contact therewith and closed at its ends to define a closed cavity inside which is enclosed an evaporable and condensable fluid.

3. The device of claim 2, wherein said block comprises a recess extended outwardly by said tube, said closed cavity being defined by said recess and said tube.

4. The device of claim 2, wherein said tube and said photovoltaic cell are disposed on opposite faces of said block.

5. The device of claim 2, wherein said tube and said block are integrally formed.

6. The device of claim 1, further comprising:
   a collector for concentrating solar radiation in a focal plane;
   and said photovoltaic cells are directed downwardly in said focal plane and with said heat pipes directed upwardly.

7. The device of claim 6 wherein said cooling chamber is supported by at least one hollow arm rigidly connected to said collector, said arm communicating with said cooling chamber for fluid flow.

* * * * *